United States Patent [19]
Finger et al.

[11] Patent Number: 5,148,107
[45] Date of Patent: Sep. 15, 1992

[54] INDUCTIVE PROXIMITY SWITCH MEANS AND METHOD

[75] Inventors: Eugene P. Finger, Brewster, N.Y.;
Bernard W. Jalbert, Richboro, Pa.;
Thomas A. Penkalski, Broad View Heights, Ohio

[73] Assignee: Yale Materials Handling Corporation, Flemington, N.J.

[21] Appl. No.: 590,311

[22] Filed: Sep. 20, 1990

Related U.S. Application Data

[63] Continuation of Ser. No. 282,611, Dec. 12, 1988, abandoned.

[51] Int. Cl.⁵ ............................................. G01B 7/14
[52] U.S. Cl. .................... 324/207.26; 324/207.11;
324/207.15; 324/207.16; 324/207.13; 324/654
[58] Field of Search ............ 324/207.11, 207.13,
324/207.15, 207.16, 207.22, 207.24, 207.26, 654,
656; 340/870.31; 307/116; 328/5; 187/9 R

[56] References Cited

U.S. PATENT DOCUMENTS

| | | | |
|---|---|---|---|
| 4,130,183 | 12/1978 | Tjönemark | 187/9 R |
| 4,219,740 | 8/1980 | Little | 340/686 |
| 4,560,929 | 12/1985 | Melnyk | 324/207.16 |
| 4,587,486 | 5/1986 | Soyck | 324/207.26 |
| 4,647,892 | 3/1987 | Hewitt | 324/208 |
| 4,649,341 | 3/1987 | Ulbrich et al. | 324/59 |
| 4,701,676 | 10/1987 | Gibson | 307/116 |

Primary Examiner—Walter E. Snow
Attorney, Agent, or Firm—John H. Crozier

[57] ABSTRACT

A proximity switch including an inductor having an actuator rod movable in proximity thereto to affect the inductance thereof. An electrical pulse of relatively short duration is applied to the inductor and the current from the inductor is measured at a selected time interval after the initiation of the pulse. When a selected value of the current is exceeded, the switch is triggered. A plurality of inductors may be sequentially interrogated by one electronic circuit, thus requiring low power and affording smooth operation. Calibration of the trigger point is accomplished electronically after mechanical installation, thus inherently compensating for mechanical tolerances and proximity effects.

30 Claims, 6 Drawing Sheets

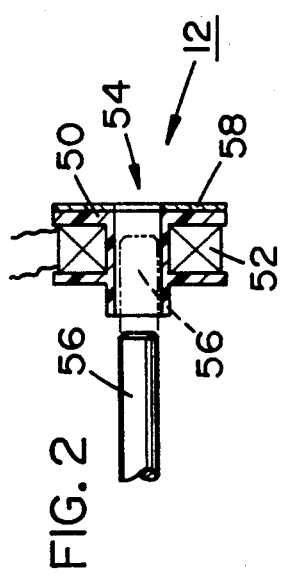
FIG. 2
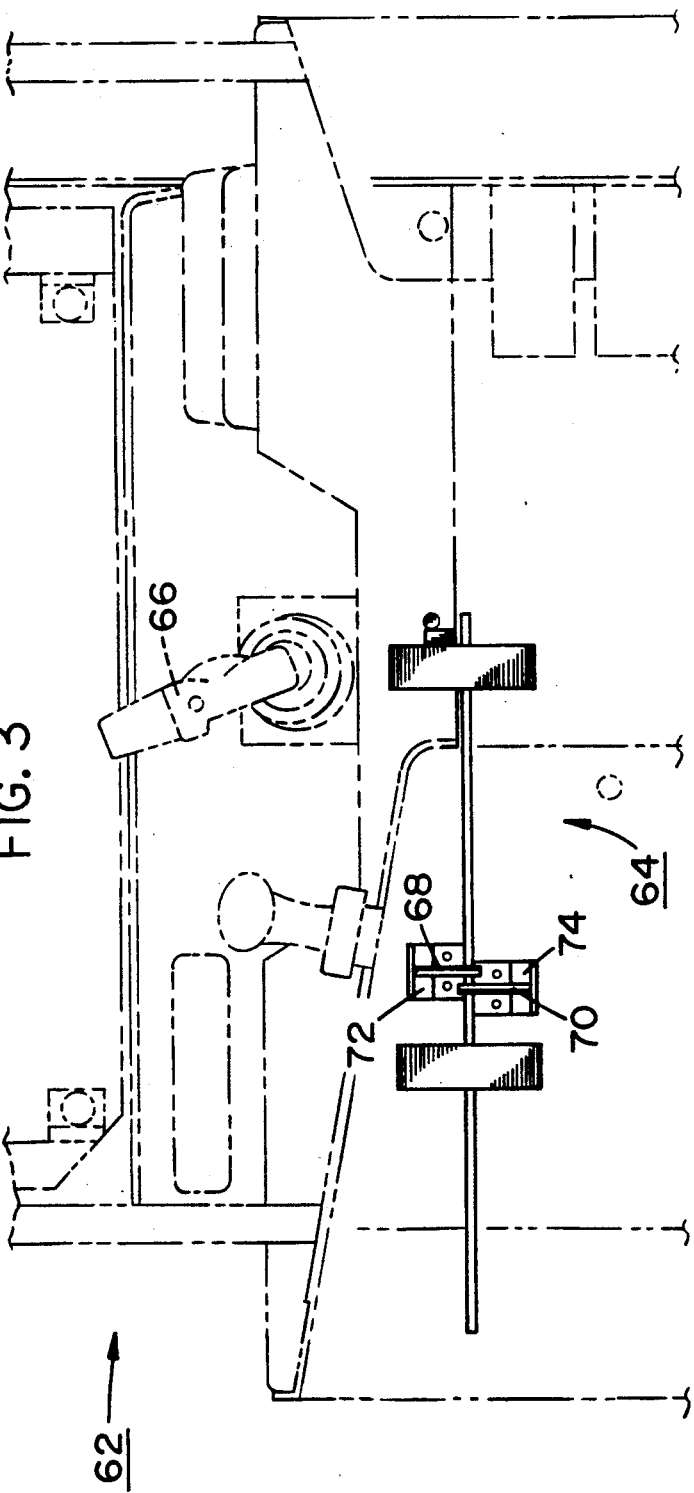
FIG. 3
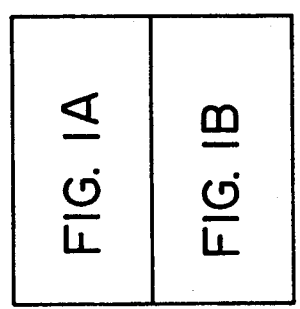
FIG. 1A
FIG. 1B
FIG. 1C

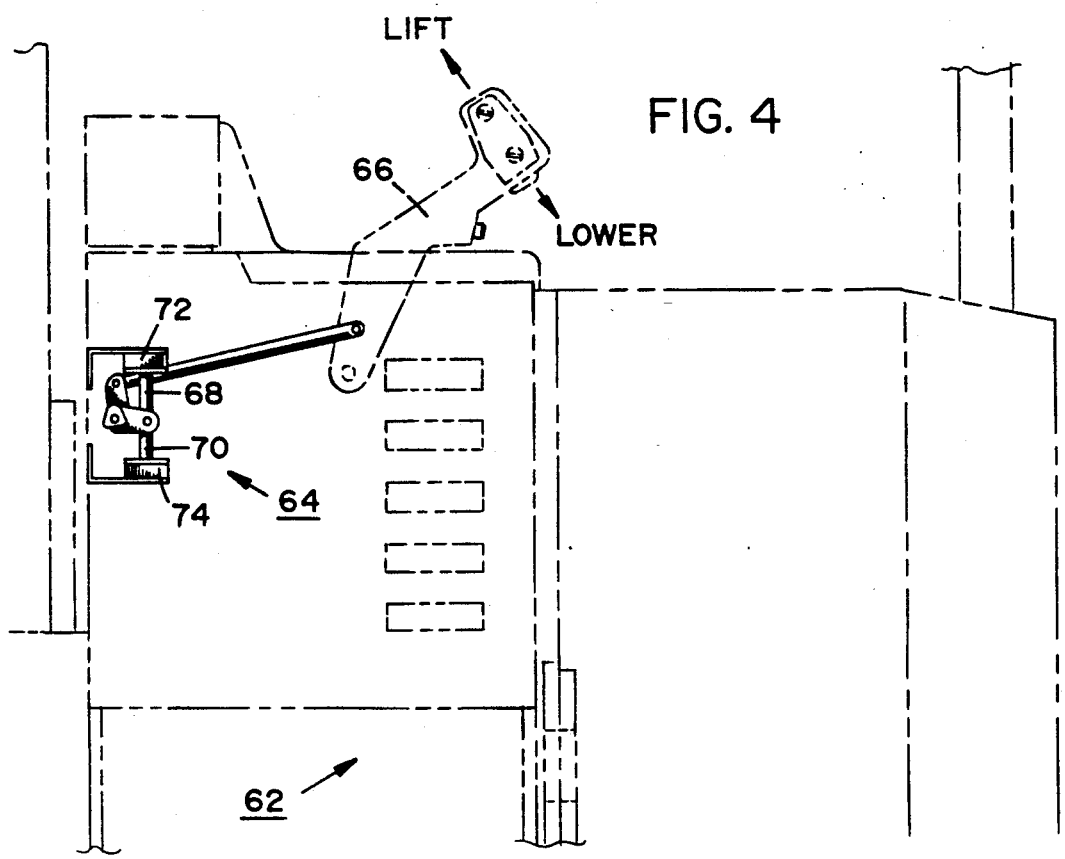
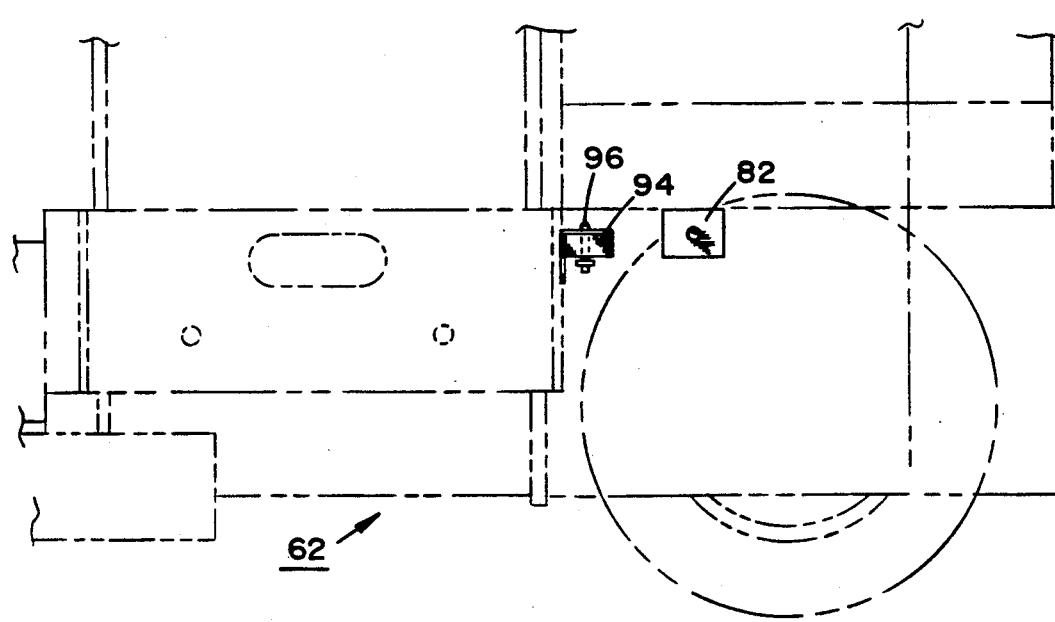

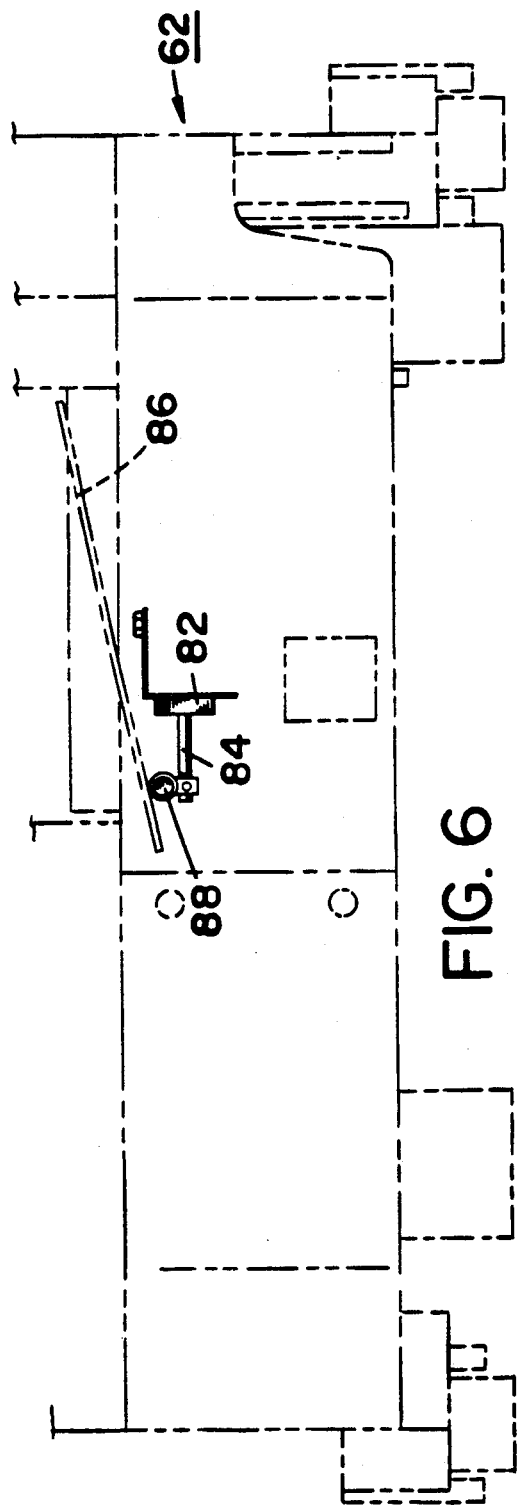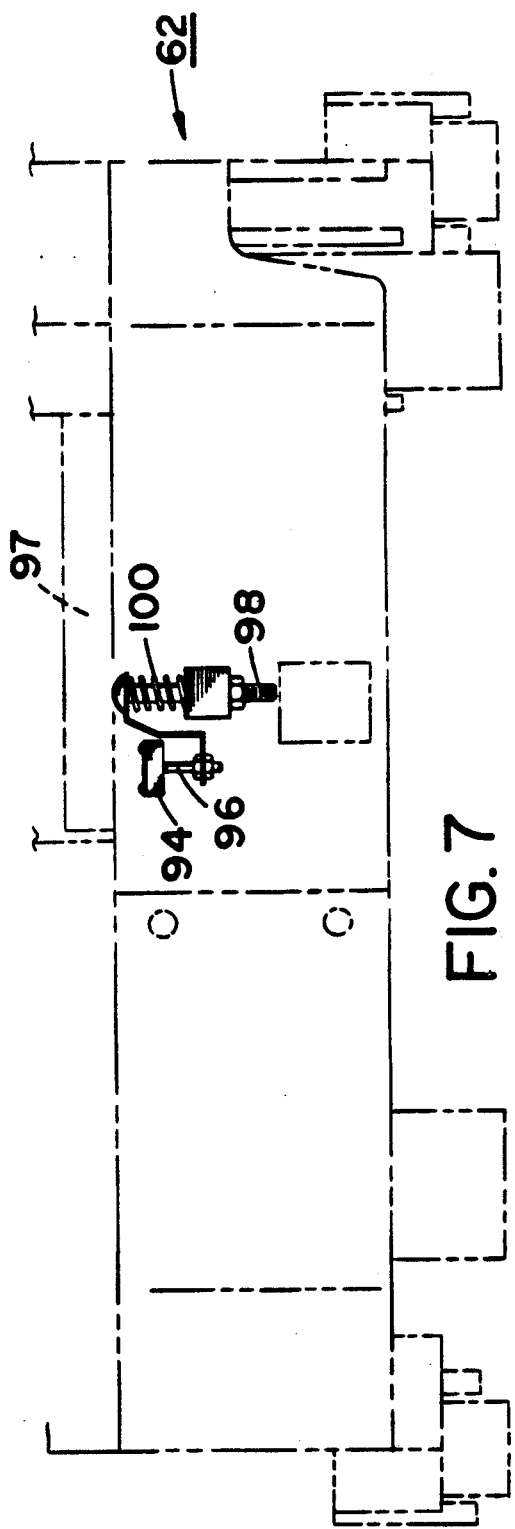

INDUCTIVE PROXIMITY SWITCH MEANS AND METHOD

This is a continuation of copending application Ser. No. 07/282,611, filed on Dec. 12, 1988, now abandoned.

BACKGROUND OF THE INVENTION

1. Field of the Invention

This invention relates to the measurement of inductance generally and, more particularly, to an electronically calibratable proximity, or inductive, switch having a high degree of sensitivity while at the same time being economically manufactured and suitable for use in harsh environments.

2. Background Art

While the present invention has numerous applications, it is especially well suited for use on mobile equipment such as fork lift trucks, manufactured, for example, by Yale Materials Handling Corporation, that may be used in industrial and other environments where the switches may be subjected to mechanical abuse, low and high temperatures, and dirty and abrasive atmospheres.

Typically, such trucks employ a number of mechanical "microswitches" which are activated by the movement of a mechanical part on the truck against a movable arm on the microswitch. The movement of the arm, in turn, effects the closing (or opening) of electrical contacts within the switch, thus providing an indicator signal that the switch has been closed or opened or a control signal as an input to some other device.

Some points of use for microswitches in fork lift trucks are those in connection with the hydraulic control system, platform switches, and brake switches. These microswitches have been found to be troublesome, due to the tolerances in the linkage which activates the switch, the mounting configuration of the switch, the fastening of the wires to the switch, the fact that the switch has contacting and moving parts, and the mechanical tolerances of the inner workings of the switch itself. Further, because a mechanical switch is an easily understood and relatively easily replaced device, it is susceptible to being blamed for most failures, which delays the eventual repair or replacement of the truly defective part.

Proximity switches are known which comprise LRC resonant circuits. When there is no metal near the inductor of the circuit, the circuit gives a high output. When metal comes within a selected distance of the inductor, the metal and the inductor become inductively coupled, the circuit is detuned, and the output of the circuit drops. Another type of known proximity switch is the magnetic switch, such as the reed switch, which is open or closed depending upon its proximity to a magnet. While these known devices are satisfactory in many applications they have a number of disadvantages. The reed switches are generally unsatisfactory in harsh environments, as sharp movements or vibrations can open or close the switches. Resonant circuits require tuning of a capacitance and an inductor and, when a given such switch is installed in a particular piece of equipment, metals other than the actuator may affect performance. Resonant circuits are also prone to electrical noise problems and are sensitive to variations in frequency and voltage. Both types require fairly careful mechanical adjustment and neither can provide multi-level position sensing. Both are relatively expensive and neither can be electronically recalibrated once installed.

Accordingly, it is a principal object of the present invention to provide an inductive switch which is electronically calibratable after installation.

Another object of the invention is to provide an inductive switch which is rugged and may be used in harsh environments with wide temperature variations.

An additional object of the invention is to provide an inductive switch which is highly accurate, yet is economical to manufacture, is easily installed, and requires little maintenance.

It is another object of the present invention to provide an inductive switch such that when a plurality of switches are used in an application, the condition of all such switches may be determined sequentially and rapidly by a single electronic circuit.

It is a further object of the present invention to provide an inductive switch that may be readily mounted in place of a microswitch.

Other objects of the invention, as well as particular features and advantages thereof, will, in part, be apparent and will, in part, be obvious from the following description and the accompanying drawing figures.

SUMMARY OF THE INVENTION

The present invention accomplishes the above objects, among others, by providing an inductor having an actuator rod movable in proximity thereto to affect the inductance thereof. An electrical pulse of relatively short duration is applied to the inductor and the current from the inductor is measured at a selected time interval after the initiation of the pulse. When a selected value of the current is reached, the switch is triggered. A plurality of inductors may be sequentially interrogated by one electronic circuit, thus requiring low power and affording smooth operation. Calibration of the trigger point is accomplished electronically after mechanical installation, thus inherently compensating for mechanical tolerances and proximity effects.

BRIEF DESCRIPTION OF THE DRAWING

FIG. 1C illustrates the arrangement of the sheets containing FIGS. 1A and 1B when joined.

FIG. 2 is a cross-sectional view of an inductive element for use in the system of FIG. 1.

FIG. 3 is a partial rear elevation view of a fork lift truck employing the present invention.

FIGS. 4 and 5 are partial side elevation views of a fork lift truck employing the present invention.

FIGS. 6 and 7 are partial rear elevation views of a fork lift truck employing the present invention.

DETAILED DESCRIPTION OF THE PREFERRED EMBODIMENTS

Figure 1A:
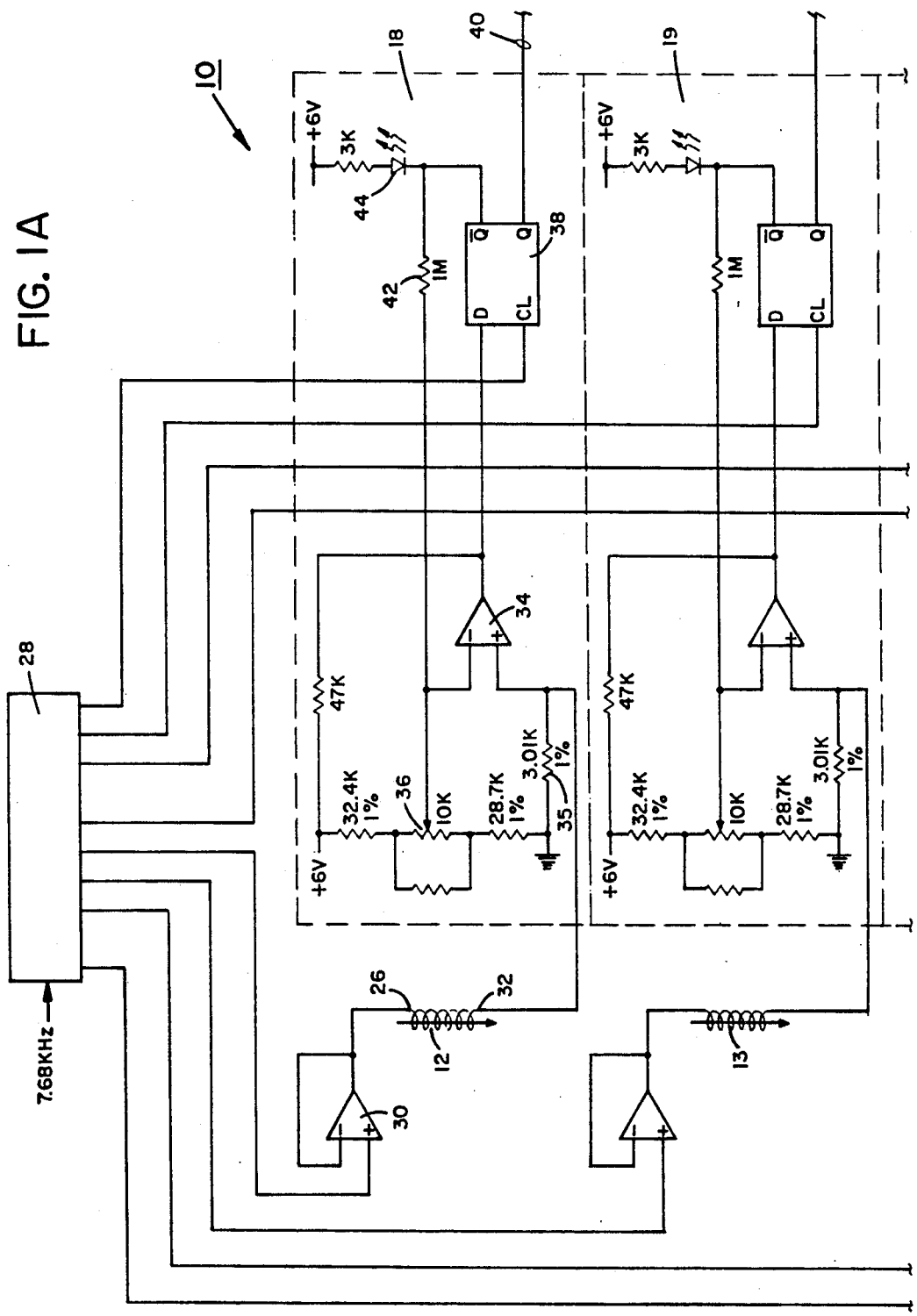
FIGS. 1A and 1B comprise an electrical schematic diagram of an inductive switch system constructed according to the present invention.
Figure 1B:
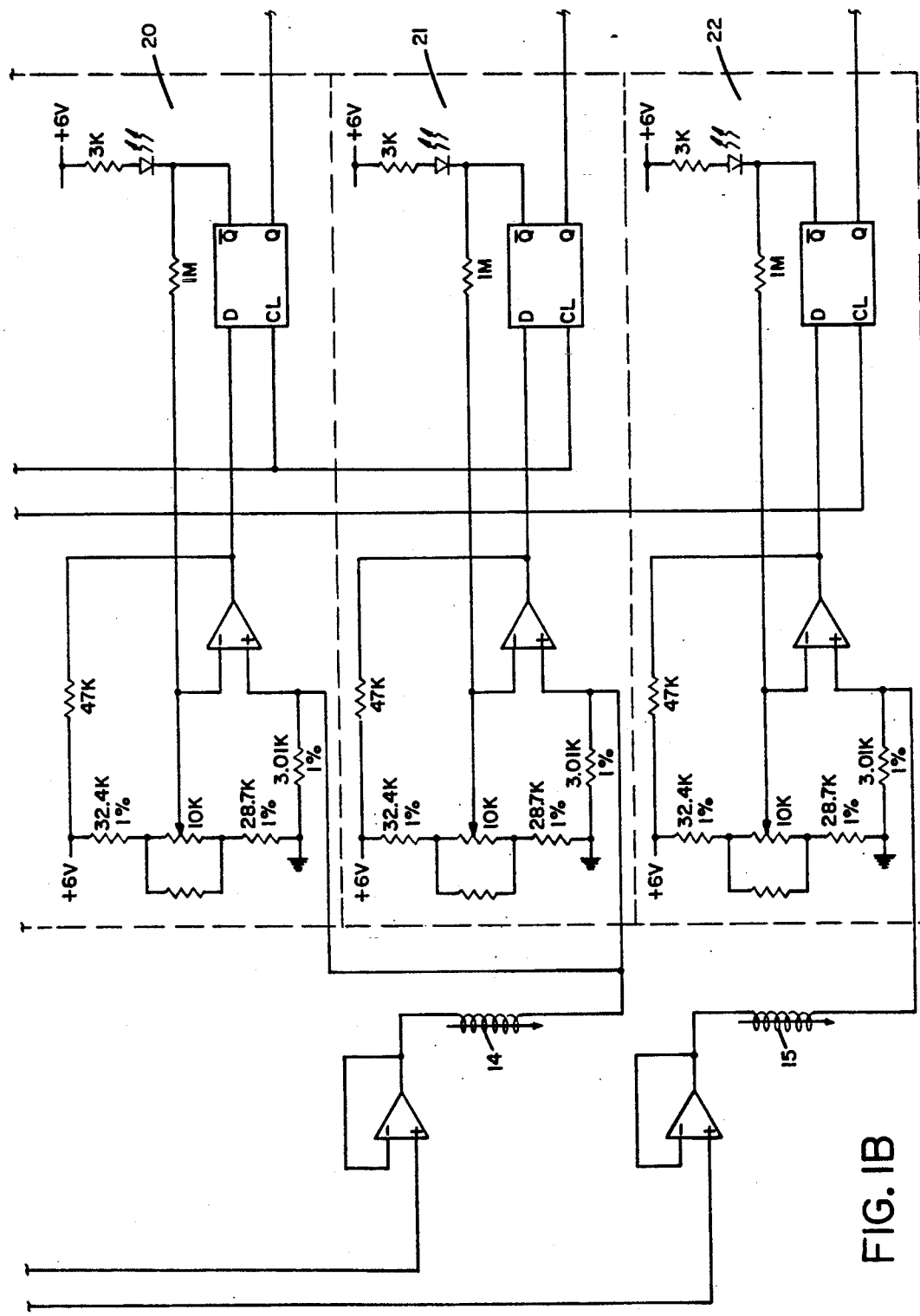

Referring now to the Drawing, FIG. 1 illustrates an inductive switch system according to the present invention, generally indicated by the reference numeral 10, which includes inductors 12, 13, 14, and 15, an example of which inductors 12 inductor 12 shown in cross-section on FIG. 2. Associated with each of inductors 12, 13, and 15 are, respectively, position detection circuits 18, 19, and 22. Associated with inductor 14 are position detection circuits 20 and 21, the function of these two position detection circuits being described in detail later.

The construction and operation of an inductor and its associated position detection circuit will be described with reference to inductor 12 and position detection circuit 18 only, as it can be seen that the other inductors and position detection circuits are constructed identically to the former with the exception of inductor 14 which has two associated position detection circuits.

Inductor 12 is connected as shown to receive, at first end 26, an electrical pulse from a divide-by-ten ring counter 28 which receives as an input a 7.68 KHz. clock. A unity-gain operational amplifier 30 is connected between divide-by-ten ring counter 28 and inductor 12 and acts as a buffer to provide isolation. Second end 32 of inductor 12 is connected to position detection circuit 18 to provide an input to comparator 34 and is also connected to ground through a sense resistor 35. The reference voltage to comparator 34 is determined by a potentiometer 36 and its associated resistor network. The output of comparator 34 provides data input to data flip-flop 38. Data flip-flop 38 is connected to be strobed by divide-by-ten ring counter 28 and to provide an output on a lead 40, which output may be connected to other, conventional circuitry for indication or control functions. Data flip-flop 38 also provides an inverted output to the reference side of comparator 34 through feedback resistor 42. An LED 44 may be provided at the inverted output of data flip-flop 38 to indicate the position of the switch.

Referring now to FIG. 2, inductor 12 includes a channel-shaped bobbin 50 on which is wound a coil 52. Formed in bobbin 50, centrally of inductor 12, is a bore 54. Bobbin 50 is disposed such that bore 54 is axially aligned with actuator rod 56 which is movable from the position shown in solid lines to the position shown in dashed lines where it extends partially into a portion of the bore around which coil 52 is wound. Actuator rod 56 also may extend through inductor 12 so that it protrudes (not shown) from the side of bobbin 50 opposite the side where it entered. Inductor 12 may also include a concentrator 58 adjacent a wall of bobbin 50. Actuator rod 56 may be assumed to be operatively connected, for example, to a moving part of a machine (not shown), where it is desired that a selected position of said part will cause a change in the output signal on lead 40 (FIG. 1).

For purposes of the discussion herein, and in accordance with standard practice when dealing with equipment such as fork lift trucks, the "iron in" condition, that is, when actuator rod 56 (FIG. 2) is inserted into inductor 12 to, or past, its "trigger point", is the inactive, or "off", condition. Conversely, the "iron out" condition, that is, when actuator rod 56 is withdrawn from inductor 12 away from the trigger point, is the active, or "on" condition. This is the preferable arrangement, since it is inherently fail safe, as a broken wire in the system circuitry or a short circuit in the driver circuitry appears to the position detection circuit as infinite inductance. Consequently, the operation being controlled by the switch will remain in its off position when such failure occurs.

For a description of the operation of the invention, it will be assumed that actuator rod 56 is in its solid-line, or iron out, position shown on FIG. 2 or otherwise does not extend into inductor 12 to its trigger point, but is moving toward its dashed-line, or iron in, position which will be assumed to be at or past the trigger point. Divide-by-ten ring counter 28 provides a relatively short first step voltage pulse of about 5 volts across inductor 12 through operational amplifier 30. The inductance of inductor 12 is then at a relatively low level thus allowing a relatively high flow of current through the inductor and presenting a relatively high voltage input to comparator 34, which voltage is the voltage across sense resistor 35. Since this voltage will be above the reference voltage to comparator 34 of on the order of 2.5 volts plus or minus a voltage increment introduced by feedback resistor 42, the output of the comparator, and, therefore, the data input to data flip-flop 38 will be high, which, when the data flip-flop is subsequently strobed by divide-by-ten ring counter 28, provides a high output on lead 40 and a low output to feedback resistor 42. The latter output allows LED 44 to energize. At a selected interval of time after the initiation of the first step pulse, preferably at the end of the first pulse, a second step pulse is generated which is applied to inductor 13 and, simultaneously, the second step pulse strobes data flip-flop 38 which, there being no change in condition, initiates no change in the state of the data flip-flop which outputs a high signal on lead 40 and a low signal to feedback resistor 42.

This sequence continues, with a third generated pulse being applied to inductor 14 and simultaneously strobing the data flip-flop in position detection circuit 19, etc. Thus, pulses are sequentially applied to each inductor in switch 10, with each pulse simultaneously strobing the data flip-flop associated with the inductor to which the preceding pulse was applied.

The interrogation pulses are preferably applied at the end of the current build up pulses, but the interrogation pulses may be applied somewhat before or somewhat after the end of the current build up pulses. The sequential energization and strobing provides for a low and even demand on the power supply and allows for smoother operation of the system, although there is no requirement in practicing the present invention that a succeeding pulse be used to interrogate a data flip-flop or that the sequential steps described for illustrative purposes be employed.

Assume, now, that inductor 12 has received a number of pulses without change in the output of data flip-flop 38; but, that before that inductor receives its next pulse, actuator rod 56 has reached the trigger point, or "iron in" condition in the inductor. Now, with this pulse, the inductance in coil 52 will be relatively high, the current from the coil will be relatively low as will the level of voltage input to comparator 34 which will give a low input to data flip-flop 38. Then, when data flip-flop is strobed by the next succeeding pulse to inductor 13, the state of the flip-flop will switch and a low signal will appear on lead 40 and a high level will be applied to feedback resistor 42 and LED 44, thus extinguishing the LED. Feedback resistor 42 adds a slight increment to the reference voltage to comparator 34, thus introducing a small amount of hysteresis into the circuit to prevent electronic chattering or oscillation.

As actuator rod 56 is withdrawn from bore 54, the trigger point will again be reached, comparator 34 will have a high output, and, when data flip-flop 38 is subsequently strobed, its outputs will return to their original values, LED 44 will energize, and feedback resistor 42 will subtract a small increment from the reference voltage.

As noted above, inductor 14 has two associated position detection circuits 20 and 21 connected in parallel with the output of the inductor. This arrangement illustrates one particular advantage of the present invention - that of being able to provide two trigger points with a single actuator. This is accomplished by adjusting the potentiometers in position detection circuits 20 and 21 so that each will respond to a different degree of insertion of an actuator rod into inductor 14, thus allowing two control functions with the same inductor element. In order to give greater differentiation between the two trigger points, one can give the actuator rod a variable shape longitudinally, such as by having a step in the diameter of the rod. It may also be advantageous in some applications to use a rod having sections of both ferromagnetic and paramagnetic materials such as soft iron and aluminum. Of course, the number of trigger points with a single inductor is not limited to two. It is also not necessary that the actuator rod have a round cross-section, but it is preferable that the rod have the same cross-sectional shape as the bore of the inductor. An important feature of the present invention is that the selection, or not, of multiple trigger points may be accomplished electronically after the inductor has been installed and requires no mechanical adjustments.

In some retrofit applications, the use of a compound actuator rod may be especially advantageous. One such application is where an existing ferromagnetic element which one desires to use as an actuator rod is attached to other elements at each end Therefore, when an inductor is placed around the actuator rod, an "iron out" condition cannot be achieved and the inductor will have relatively constant high inductance regardless of the position of the rod. Here, the solution is to place a thin copper sleeve over a portion of the rod to shield that portion from the inductor. The copper sleeve is so positioned that, when that portion of the rod on which the sleeve is mounted is inserted into the inductor, the inductance will be low and an "iron out" condition will be achieved and, when that portion of the rod on which the sleeve is mounted is withdrawn from the inductor, the inductance will be high and an "iron in" condition will be achieved. Although the copper sleeve does not shield the rod to the extent that the inductor "sees" perfect air, the difference is enough that satisfactory performance may be realized. The copper sleeve is preferably adhesively attached to the rod.

A particular advantage of the switch of the present invention is that there are no components that require tuning, such as with LRC circuits, and the switch can be electronically calibrated after installation in the field. For example, within reasonable limits, the inductor element may be installed in a piece of machinery without regard to exact tolerances or special concern for the proximity of ferromagnetic materials unrelated to the switch. Then, whatever (usually a rod) the motion of which is to actuate the switch is moved to the desired trigger point and the potentiometer in the position detection circuit is adjusted to give the exact "trigger point". Such means of calibration compensates for inaccuracies in the physical mounting of the inductor element and its associated actuator rod as well as any lash of the rod, metal parts in proximity to the inductor element, and even variations in the construction of the inductor element itself.

For the inductive switch system described, a pulse interval of on the order of about 130 microseconds has been found to be satisfactory, although pulse intervals may range from about 10 microseconds to about 1 millisecond. Because of the shortness of the pulse, a large number of switches can be interrogated sequentially. The lower end of the range of pulse lengths is limited by what practical electronics can handle, while the upper end of the range becomes limited by the higher inductances required. The width of the interrogation pulse can be conveniently selected to be the same time interval as the energizing pulse, although it may also be selected to be less. When selecting component values and impulse times, it must be kept in mind that the inductor should preferably discharge to a zero level, or essentially a zero level, before the succeeding pulse is applied. It is also desirable that the inductance-versus-actuator rod position curve be fairly linear and steep in the area of the trigger point. Use of an inductor as a constant current generator provides smoothing and keeps the system noise free.

For the values of the components shown on FIG. 1, an inductor coil having about 4680 turns of #39 AWG copper wire (approximately 8760 inches) wound with an inner diameter of about 0.385 inch and a length of about 0.360 inch gives satisfactory performance. Such a coil exhibits an inductance of about 218 milliHenrys and a resistance of about 622 Ohms at 25 degrees Centigrade. It has been found that the inductive switch system described is accurate and repeatable to at least a few thousandths of an inch and is inherently temperature independent over a fairly large range; however, if some application exhibit an intolerable position-versus-inductance temperature coefficient, temperature compensation may be provided within the coil structure or within the electronic circuitry by means known in the art.

It has been found that the use of a concentrator extends the length of the transfer function of the inductor without requiring the use of a longer coil. A similar lengthening may be obtained by using multiple stacked coils and/or permitting the actuator rod to extend through the bore of the inductor. This lengthening effect can be of particular value when,.for example, the inductor of the present invention is being substituted for, say, a microswitch in an existing application.

The material of the actuator rod of an inductor is preferably soft iron and the concentrator is preferably formed from cold-rolled steel, although the system is quite tolerant of alloy variations. For a coil having on the order of the above dimensions, the concentrator should be at least on the order of 0.06-inch thick and extend to the outer perimeter of the coil of the inductor. The concentrator element may also be a bracket on which the inductor is mounted. It has been found that when the perimeter of the concentrator extends to the outer perimeter of the coil, it has essentially the same effect as a steel plate of infinite area. Thus, standardizing the material immediately adjacent the inductor by having the outer dimensions of the concentrator at least coextensive with the coil reduces proximity effects by making them uniform and thereby enhances ease of installation because the user will obtain uniform performance regardless of whether the inductor is mounted on metal of a greater or lesser area.

The bobbin may be constructed of any suitable dielectric material and glass-filled nylon has been found to be especially satisfactory.

It can be seen that all components of the inductive switch system are conventional and, in effect, the invention uses imprecise parts to make a very precise device.

As noted above, the actuator rod may be that already existing in a retrofit situation and the inductor used may even be that formerly used in an RLC switch, so that no mechanical changes at all may be required—it only being necessary to connect the electronics of the present invention. Since the current from the inductor is being measured resistively, there are no components in the system which require tuning. The inductive switch system, having but one moving part—the actuator rod—and no exposed contacts is very rugged and environmentally secure and, if necessary, the electronics can be located well away from areas that might be detrimental to them.

FIGS. 3-7 illustrate the application of the present invention to various functions in a fork lift truck, generally indicated by the reference numeral 62. In each case, it may be assumed that the inductor has replaced a microswitch or other switching element having the undesirable features discussed above.

FIGS. 3 and 4 show the platform lift/lower switching mechanism, generally indicated by the reference numeral 64, mechanically linked to a control handle 66. Switching mechanism 64 includes actuator rods 68 and 70, with the rods disposed so that movement of control handle 66 will cause the rods to move axially in and out of inductors 72 and 74, respectively. Thus, if control handle 66 is raised, actuator rod 68 will advance into inductor 72 and actuator rod 70 will be withdrawn from inductor 74. The withdrawal of actuator rod 70 out of inductor 74 and away from its trigger point, to its iron out condition, causes the platform of the fork lift truck to rise. Lowering of control handle 66 will reverse the movement of actuator rods 68 and 70 and withdrawal of actuator rod 68 from inductor 72 and away from its trigger point, to its iron out condition, causes the platform to lower.

FIGS. 5 and 6 show the mounting of brake switch inductor 82 and its associated actuator rod 84. Actuator rod 84 is advanced or withdrawn from inductor 82 by releasing or depressing brake pedal 86 which causes shaft 88 to rotate.

FIGS. 5 and 7 show the mounting of platform switch inductor 94 and its associated actuator rod 96. Here, when treadle 97 of fork lift truck 62 is depressed, bolt 98 will be driven downward, compressing spring 100 and withdrawing actuator rod 96 to the trigger point of the platform switch. Likewise, releasing treadle 97 causes actuator rod 96 to be advanced into inductor 94. FIG. 7 also indicates a significant advantage of the inductive switch of the present invention, that of being able to tolerate a large amount of overtravel, which most mechanical switches cannot.

Figure 8:
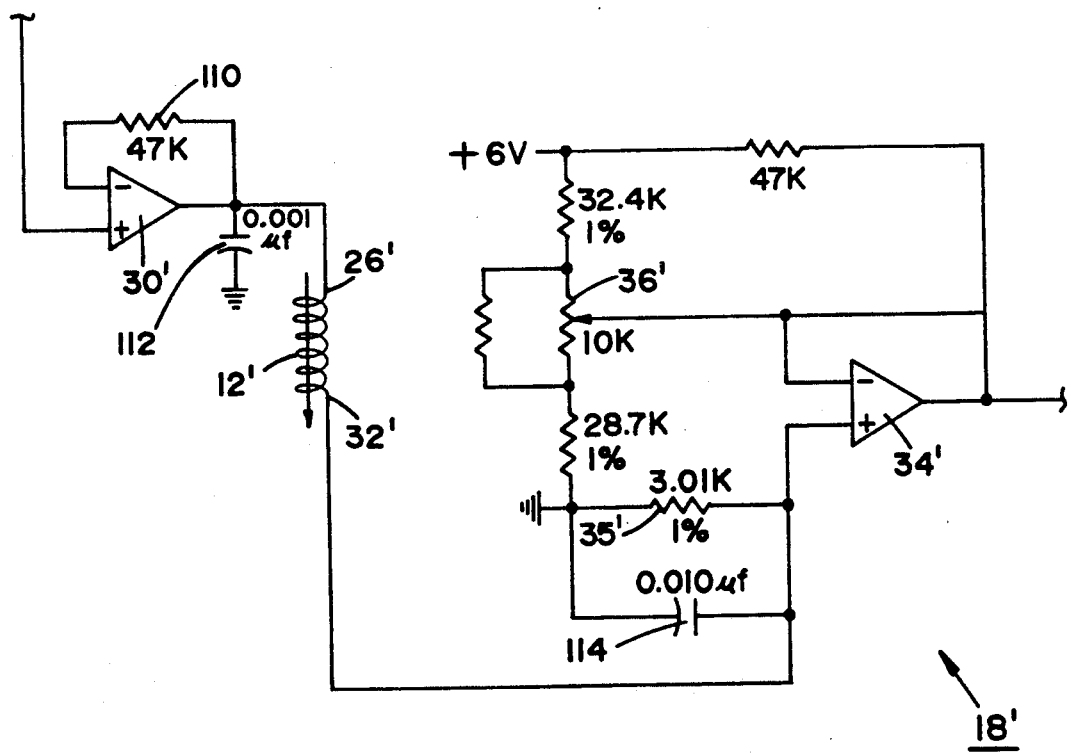
FIG. 8 is an electrical schematic diagram of a portion of that of FIG. 1A according to an alternative embodiment of the present invention.

FIG. 8 shows a portion of position detection circuit 18 of FIG. 1A, generally indicated by the reference numeral 18', with elements common to FIG. 1A given primed reference numerals, together with its associated inductor 12' and operational amplifier 30'. In addition to the common elements shown on FIG. 1A, a resistor 110 is inserted in the feedback loop of operational amplifier 30', a grounded capacitor 112 is connected to the output of the operational amplifier, and a capacitor is connected around resistor 35'. The embodiment shown on FIG. 8 is particularly advantageous when the input line to operational amplifier 30' is relatively long and is located in an environment where electromagnetically coupled transient potentials may be developed. This is especially true in the case of electrically driven fork lift trucks where the chopper drive for the electric motor may be switching currents of 200–300 amperes. With position detection circuit 18 on FIG. 1, the transient may be high enough that, depending on the devices specified, operational amplifier 30 may be driven out of its common mode range and lock up.

In position detection circuit 18', capacitor 112 prevents the output of operational amplifier 30' from responding too quickly, while resistor 110 limits the current that can be fed back. Likewise, capacitor 114 is provided to help discharge any effects of the transient which may pass to position detection circuit 18'. The values of resistor 110 and capacitors 112 and 114 are chosen so that these elements do not interfere with normal operation. The electronics (not shown) associated with the inductors shown on FIGS. 3-8 may be located away from the inductors and may be in a completely sealed structure on fork lift truck 62, access normally being required only for purposes of calibration. With the electronics so protected, nothing in the switch system is susceptible to failure due to exposure to dirt, dust, or some degree of abuse. The inductive element itself is easily replaced by mechanics of ordinary skill.

Some considerations in the design of inductors and the measurement of inductance are discussed in "Inductance Calculations", by Frederick W. Crover, 1980, Published by the Instrument Society of America, and "Absolute Measurements in Electricity and Magnetism", by Andrew Gray, 1967, published by Dover Publications, which books and the references cited therein are made a part hereof by reference.

It will thus be seen that the objects set forth above, among those made apparent from the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

We claim:

1. An inductive switch, comprising:
   (a) inductor means;
   (b) actuator means movable with respect to said inductor means, said movement affecting the value of inductance of said inductor means;
   (c) means to apply an electrical pulse of a selected duration to said inductor means;
   (d) means to measure the level of current directly from said inductor means a selected time interval after the initiation of said electrical pulse and to provide a switching signal output when said level of current is above a predetermined value; and
   (e) said means to measure remains directly connected to said inductor means until said level of current is measured.

2. An inductive switch, as defined in claim 1, wherein said means to measure said level of said current comprises:
   (a) a comparator having a reference voltage applied to a first input and having the output of said inductor means applied to a second input; and (b) a sense resistor connected between said output of said inductor means and ground;

whereby, when one of a succession of pulses causes said inductance of said inductor means to cause said level of current to exceed said predetermined level, the output of said comparator will change.

3. An inductive switch, as defined in claim 2, wherein said sense resistor has a resistance on the order of about five times the resistance of said inductor means.

4. An inductive switch, as defined in claim 2, further comprising a data flip-flop connected to receive as its data input the output of said comparator.

5. An inductive switch, as defined in claim 4, further comprising a second inductor means connected to said means to apply an electrical pulse and said data flip-flop is connected to receive as its strobe pulses the electrical pulses applied to said second inductor means; such that, when one said pulse of a succession of said pulses causes said data input to said data flip-flop to change, the next succeeding pulse of said succession of pulses will strobe said data flip-flop to change the state thereof and to so indicate on the outputs therefrom.

6. An inductive switch, as defined in claim 4, further comprising
   (a) the noninverting output of said data flip-flop adapted to be connected to circuitry to receive said noninverting output as the output of said inductive switch; and
   (b) a feedback resistor connected between the inverting output of said data flip-flop and the first input of said comparator.

7. An inductive switch, as defined in claim 1, wherein said selected duration of said pulse is on the order of from about 10 microsecond to about 1 millisecond.

8. An inductive switch, as defined in claim 1, wherein said selected duration of said pulse is on the order of about 130 microsecond.

9. An inductive switch, as defined in claim 1, wherein said inductor means comprises a coil of wire.

10. An inductive switch, as defined in claim 9, wherein said inductor means further comprises a concentrator disposed at one end of said coil of wire so as to extend the transfer function of said inductor means.

11. An inductive switch, as defined in claim 1, wherein said inductive switch is mounted in a fork lift truck.

12. A method of measuring the inductance of an inductor, comprising:
   (a) providing inductor means;
   (b) applying an electrical pulse of a selected duration to said inductor means; and
   (c) providing means to measure the level of current directly from said inductor means a selected time interval after the initiation of said electrical pulse, said current being proportional to the value of inductance of said inductor means, and maintaining said means to measure directly connected to said inductor means until said level of current is measured.

13. A method, as defined in claim 12, further comprising:
   (a) means movable with respect to said inductor means, said movement affecting the value of inductance of said inductor means;
   (b) providing a comparator having a reference voltage applied to a first input and the output of said inductor means applied to a second input; and
   (c) providing a sense resistor connected between said output of said inductor means and ground;

whereby, when one of a succession of said pulses causes said inductance of said inductor means to cause said level of current to exceed a predetermined level, the output of said comparator will change.

14. A method, as defined in claim 13, further comprising the step of providing said sense resistor having a resistance on the order of about five times the resistance of said inductor means.

15. A method, as defined in claim 13, further comprising providing a data flip-flop connected to receive as its data input the output of said comparator.

16. A method, as defined in claim 15, further comprising providing second inductor means connected to receive an electrical pulse of said selected duration and connecting said data flip-flop to receive as its strobe pulses the pulses applied to said second inductor means; whereby, when one said pulse of a succession of said pulses causes said data input to said data flip-flop to change, the next succeeding pulse of said succession of pulses will strobe said data flip-flop to change the state thereof and to so indicate on the outputs therefrom.

17. A method, as defined in claim 15, further comprising:
   (a) providing the noninverting output of said data flip-flop as the output of said inductive switch; and
   (b) providing a feedback resistor connected between the inverting output of said data flip-flop and the first input of said comparator.

18. A method, as defined in claim 12, wherein said selected duration of said pulse is on the order of from about 10 microsecond to about 1 millisecond.

19. A method, as defined in claim 12, wherein said said selected duration of said pulse is on the order of about 130 microsecond.

20. A method, as defined in claim 12, wherein said inductor means comprises a coil of wire.

21. A method, as defined in claim 20, wherein said inductor means further comprises a concentrator disposed at one end of said coil of wire so as to extend the transfer function of said inductor means.

22. A method, as defined in claim 12, wherein said inductor means is mounted in a fork lift truck.

23. An inductive switch, as defined in claim 10, wherein the outer dimension of said concentrator is at least coextensive with the outer dimension of said coil.

24. An inductive switch, as define din claim 11, wherein said fork lift truck has a platform control handle, and said inductive switch further comprises:
   (a) an actuator rod operatively connected to said control handle; and
   (b) movement of said handle will cause said actuator rod to advance into or withdraw form a bore defined in said inductor, thereby causing a change in the inductance of said inductor.

25. An inductive switch, as defined in claim 11, wherein said fork lift truck has a brake treadle, and said inductive switch further comprises:
   (a) an actuator rod operatively connected to said brake treadle; and
   (b) movement of said brake treadle will cause said actuator rod to be advanced into or withdrawn from a bore defined in said inductor, thereby changing the inductance of said inductor.

26. An inductive switch, as defined in claim 11, wherein said fork lift truck has a platform treadle, said inductive switch further comprising:

(a) an actuator rod operatively connected to said platform treadle; and
(b) movement of said platform treadle will cause said actuator rod to advance into or withdraw from a bore defined in said inductor, thereby changing the inductance of said inductor.

27. A method, as defined in claim 21, wherein the outer dimension of said concentrator is at least coextensive with the outer dimension of said coil.

28. A method, as defined in claim 22, wherein said fork lift truck has a platform control handle, and said inductive switch further comprises:
(a) an actuator rod operatively connected to said control handle; and
(b) movement of said handle will cause said actuator rod to advance into or withdraw from a bore defined in said inductor, thereby causing a change in the inductance of said inductor.

29. A method, as defined in claim 22, wherein said fork lift truck has a brake treadle, and said inductive switch further comprises:
(a) an actuator rod operatively connected to said brake treadle; and
(b) movement of said brake treadle will cause said actuator rod to be advanced into or withdrawn from a bore defined in said inductor, thereby changing the inductance of said inductor.

30. A method, as defined in claim 22, wherein said fork lift truck has a platform treadle, said inductive switch further comprising:
(a) an actuator rod operatively connected to said platform treadle; and
(b) movement of said platform treadle will cause said actuator rod to advance into or withdraw from a bore defined in said inductor, thereby changing the inductance of said inductor.

* * * * *